United States Patent
King

(10) Patent No.: US 10,630,320 B2
(45) Date of Patent: Apr. 21, 2020

(54) METHODS FOR RE-USING FILTERS FOR UPLINK CARRIER AGGREGATION

(71) Applicant: SKYWORKS SOLUTIONS, INC., Woburn, MA (US)

(72) Inventor: Joel Richard King, Newbury Park, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 16/162,290

(22) Filed: Oct. 16, 2018

(65) Prior Publication Data

US 2019/0052291 A1 Feb. 14, 2019

Related U.S. Application Data

(63) Continuation of application No. 15/651,241, filed on Jul. 17, 2017, now Pat. No. 10,103,754.

(60) Provisional application No. 62/363,273, filed on Jul. 17, 2016.

(51) Int. Cl.
| | |
|---|---|
| *H04B 1/10* | (2006.01) |
| *H04B 1/00* | (2006.01) |
| *H04B 1/56* | (2006.01) |
| *H04B 1/04* | (2006.01) |
| *H03F 1/02* | (2006.01) |

(52) U.S. Cl.
CPC .............. *H04B 1/0057* (2013.01); *H04B 1/56* (2013.01); *H03F 1/0277* (2013.01); *H03F 2200/171* (2013.01); *H04B 1/0458* (2013.01); *H04B 1/0483* (2013.01)

(58) Field of Classification Search
CPC ...... H04B 1/0057; H04B 1/56; H04B 1/0458; H04B 1/0483; H04B 1/04; H04B 1/03; H04B 1/1081; H04B 2001/0408; H03F 1/0277; H03F 2200/171; H01Q 1/2266; H01Q 1/243; H01Q 21/0025; H01Q 21/065; H01Q 21/28
See application file for complete search history.

(56) References Cited

U.S. PATENT DOCUMENTS

| | | | | |
|---|---|---|---|---|
| 10,103,754 | B2 * | 10/2018 | King | H04B 1/56 |
| 10,116,339 | B2 * | 10/2018 | Anthony | H03F 3/24 |
| 10,135,469 | B2 * | 11/2018 | Chang | H04B 1/48 |
| 10,164,666 | B2 * | 12/2018 | Khlat | H04B 1/0092 |
| 10,182,403 | B2 * | 1/2019 | Ripley | H04W 52/04 |
| 2019/0215774 | A1 * | 7/2019 | Ripley | H04B 17/101 |

* cited by examiner

*Primary Examiner* — Sonny Trinh
(74) *Attorney, Agent, or Firm* — Chang & Hale LLP

(57) ABSTRACT

Disclosed herein are systems, circuits, architectures and methods related to front-end architectures for wireless devices configured for uplink carrier aggregation. The disclosed methods dynamically route signals from a filter-less module to one of two modules with filters for filtering. The re-use of filters reduces the size of the filter-less module relative to a module that utilizes its own filters, thereby reducing costs, reducing size, and/or providing additional space for other modules or other functionality to be included in a wireless device.

20 Claims, 4 Drawing Sheets

METHODS FOR RE-USING FILTERS FOR UPLINK CARRIER AGGREGATION

CROSS-REFERENCE TO RELATED APPLICATIONS

This application is a continuation of U.S. application Ser. No. 15/651,241 filed Jul. 17, 2017 and entitled "Architectures and Methods Related to Transmit Signal Routing With Re-Use of Filters," which claims priority to U.S. Provisional Application No. 62/363,273 filed Jul. 17, 2016 and entitled "Architectures and Methods Related to Transmit Signal Routing with Re-Use of Filters," each of which is expressly incorporated by reference herein in its entirety for all purposes.

BACKGROUND

Field

The present disclosure generally relates to wireless devices configured for carrier aggregation, and more particularly to front-end architectures for uplink carrier aggregation.

Description of Related Art

Carrier aggregation (CA) is a data transmission strategy that transmits data across multiple frequency bands to increase the bandwidth, and thereby to increase the bitrate. Each aggregated carrier is referred to as a component carrier. In some scenarios, CA uses contiguous component carriers within the same operating frequency band. In other scenarios, the component carriers belong to the same operating frequency band, but have a gap, or gaps, in between. In yet other scenarios, component carriers belong to different operating frequency bands.

SUMMARY

According to a number of implementations, the present disclosure relates to a front-end architecture for a wireless device wherein the front-end architecture includes a first module having a power amplifier, a switch assembly at an output of the power amplifier, and a plurality of filters. The front-end architecture also includes a second module having a power amplifier and a switch assembly at an output of the power amplifier, the switch assembly of the first module in communication with the switch assembly of the second module. The switch assemblies of the first and second modules are configured to route an amplified signal from the power amplifier of the second module to a selected one of the plurality of filters of the first module.

In some embodiments, the front-end architecture also includes a third module having a power amplifier, a switch assembly at an output of the power amplifier, and a plurality of filters. In further embodiments, the switch assemblies of the second and third modules are configured to route an amplified signal from the power amplifier of the second module to a selected one of the plurality of filters of the third module. In further embodiments, the first module is a high-band power amplifier module with integrated duplexers, and the third module is a mid-band power amplifier module with integrated duplexers. In further embodiments, the second module is a power amplifier module configured to amplify a mid-band signal or a high-band signal. In further embodiments, the switch assemblies of the first and second modules are configured to provide uplink carrier-aggregation operation with a high-band signal amplified and filtered by the high-band power amplifier module with integrated duplexers and a mid-band signal amplified by the power amplifier module and filtered by the high-band power amplifier module with integrated duplexers. In other further embodiments, the switch assemblies of the third and second modules are configured to provide uplink carrier-aggregation operation with a mid-band signal amplified and filtered by the mid-band power amplifier module with integrated duplexers and a high-band signal amplified by the power amplifier module and filtered by the mid-band power amplifier module with integrated duplexers. In other further embodiments, the power amplifier module is a filter-less module. In further embodiments, the front-end architecture also includes a first power management unit configured to provide supply power to the high-band power amplifier module with integrated duplexers or to the low-band power amplifier module with integrated duplexers. In further embodiments, the front-end architecture also includes a second power management unit configured to provide supply power to the filter-less power amplifier module.

In some embodiments, the front-end architecture also includes a first power management unit configured to provide supply power to the first module and a second power management unit configured to provide supply power to the second module. In further embodiments, the first power management unit provides power to the first module to amplify a signal in a first frequency band and provides power to a third module to amplify a signal in a second frequency band. In further embodiments, the third module includes a power amplifier, a switch assembly at an output of the power amplifier, and a plurality of filters.

According to a number of implementations, the present disclosure relates to a wireless device that includes an antenna configured to facilitate transmission of signals. The wireless device also includes a front-end system in communication with the antenna. The front-end system includes a high-band power amplifier module with integrated duplexers, a mid-band power amplifier module with integrated duplexers, and a filter-less power amplifier module. The front-end system is configured to provide uplink carrier-aggregation operation with a high-band signal amplified and filtered by the high-band power amplifier module with integrated duplexers and a mid-band signal amplified by the filter-less power amplifier module and filtered by the high-band power amplifier module with integrated duplexers. The front-end system is also configured to provide uplink carrier-aggregation operation with a mid-band signal amplified and filtered by the mid-band power amplifier module with integrated duplexers and a high-band signal amplified by the filter-less power amplifier module and filtered by the mid-band power amplifier module with integrated duplexers.

In some embodiments, the front-end system further includes a low-band power amplifier module. In some embodiments, the filter-less power module is configured to amplify a mid-band signal or a high-band signal.

In some embodiments, the front-end system further includes a first power management unit operatively coupled to the high-band power amplifier with integrated duplexers and to the mid-band power amplifier with integrated duplexers. In further embodiments, the front-end system further includes a second power management unit operatively coupled to the filter-less power amplifier module. In further embodiments, the first power management unit provides a supply voltage to the high-band power amplifier with integrated duplexers and the second power management unit provides a supply voltage to the filter-less power amplifier module to provide the uplink carrier-aggregation operation with the high-band signal amplified and filtered by the high-band power amplifier module with integrated duplexers and the mid-band signal amplified by the filter-less power amplifier module and filtered by the high-band power amplifier module with integrated duplexers. In other further embodiments, the first power management unit provides a supply voltage to the mid-band power amplifier with integrated duplexers and the second power management unit provides a supply voltage to the filter-less power amplifier module to provide the uplink carrier-aggregation operation with the mid-band signal amplified and filtered by the mid-band power amplifier module with integrated duplexers and the high-band signal amplified by the filter-less power amplifier module and filtered by the mid-band power amplifier module with integrated duplexers.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
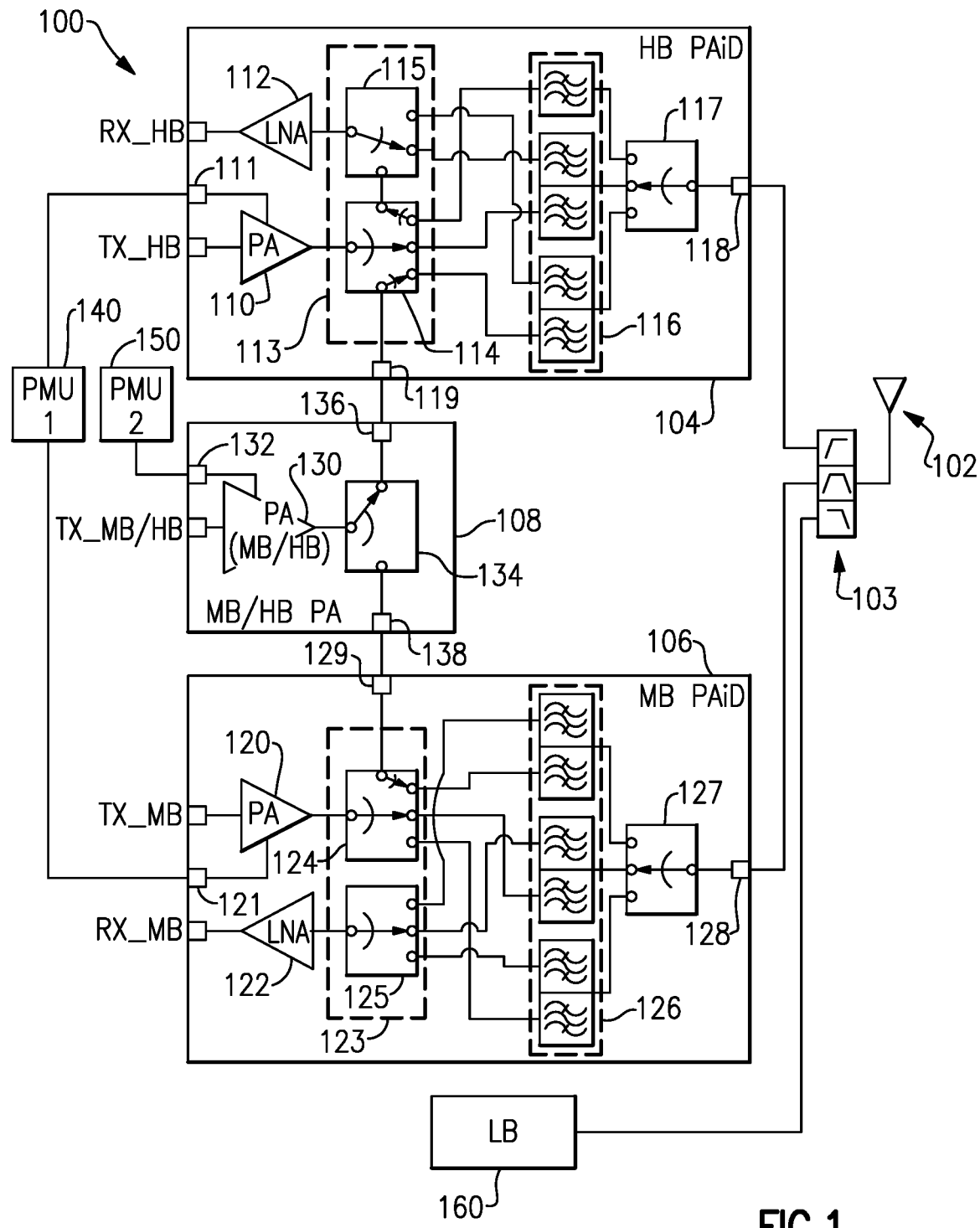
FIG. 1 illustrates a front-end architecture configured to provide uplink carrier aggregation functionality for mid-band and high-band signals.

The headings provided herein, if any, are for convenience only and do not necessarily affect the scope or meaning of the claimed invention.

Transmit chains used in front-end architectures that support multiple simultaneous active transmit signals in different bands are often constrained by their respective power management units (PMUs) being able to deliver efficient supply voltages to the different transmit chains and power amplifiers (PAs). For example, low-band (LB) (e.g., 700-960 MHz), mid-band (MB) (e.g., 1710-2200 MHz), and high-band (HB) (e.g., 2300-2690 MHz) band groupings are typically used in modern cell phones, and integrated PA+Duplexer (also referred to as PA with integrated duplexers, or PAiD) modules are often designed to support one of these band groups with associated power amplifiers and filters for band support.

If an MB PAiD and an HB PAiD share a common PMU for supply voltage, then it can be challenging to transmit simultaneously from the two modules due to issues associated with one or more of isolation, gain variation with supply voltage Vcc, and efficiency performance. Thus, to process a second transmit (Tx) signal in an uplink (UL) carrier-aggregation (CA) application, a PA module processing such a second Tx signal is often required to be provided with a separate PMU. Such a dedicated UL CA power amplifier module (PAM) would typically require significant filter duplication to support required simultaneous MB+HB operation.

Accordingly, described herein are examples of front-end architectures for wireless devices configured for uplink carrier aggregation. The front-end architecture includes a first power amplifier module with filters and a second filter-less power amplifier module. The front-end architecture is configured to route signals from the filter-less power amplifier module to the first power amplifier module for filtering. This reduces the size of the second filter-less module relative to a module that utilizes its own filters, thereby reducing costs, reducing size, and/or providing additional space for other modules or other functionality to be included in a wireless device.

The disclosed front-end architectures can reduce power consumption during uplink carrier aggregation as well. For example, a single power management unit can be configured to selectively provide power to different PAiD modules that are configured to amplify signals in different frequency bands while a second power management unit can be configured to power a filter-less PA module, which consumes less power than the PAiD modules. When providing uplink carrier aggregation operation, the first power management unit can provide power to a single PAiD module and the second power management unit can provide power to the filter-less PA module. Switching networks can be provided in the respective modules to route signals from the filter-less PA module to the PAiD module for filtering, thereby re-using filters. This can save power because the wireless device is not powering two PAiD modules.

FIG. 1 illustrates a front-end architecture 100 configured to provide UL CA functionality for MB and HB. Although various examples are described in the context of such bands, it will be understood that one or more features of the present disclosure can also be implemented in other pairs of band groups.

An antenna 102 facilitates transmit (Tx) operations of radio-frequency (RF) signals in mid-band (MB) and high-band (HB) frequency ranges. Such an antenna can also facilitate Tx and/or receive (Rx) operations for low-band (LB) signals (e.g., through an LB PA 160); however, for the purpose of description, it will be assumed that the two band groupings include MB and HB.

The front-end architecture 100 includes a PAiD module 104 configured to provide duplexed Tx and Rx operations for HB bands. For example, an input port TX_HB can receive an RF signal to be amplified and transmitted. Such a signal can be amplified by a PA 110 and be routed to the antenna 102 through a post-PA switch 114 of a band-selection switch assembly 113, a duplexer of a duplexer/filter assembly 116, an antenna switch 117, an antenna port 118, and a high-pass filter of a filter assembly 103. For the Rx operation, a signal received by the antenna 102 can be processed by the HB PAiD module 104 and be output at a port RX_HB. Such a received signal can be passed through the high-pass filter of the filter assembly 103, the antenna port 118, the antenna switch 117, a duplexer of the duplexer/filter assembly 116, a pre-LNA switch 115 of the band-selection switch assembly 113, and a low-noise amplifier (LNA) 112.

Similarly, the front-end architecture 100 includes a PAiD module 106 configured to provide duplexed Tx and Rx operations for MB bands. For example, an input port TX_MB can receive an RF signal to be amplified and transmitted. Such a signal can be amplified by a PA 120 and be routed to the antenna 102 through a post-PA switch 124 of a band-selection switch assembly 123, a duplexer of a duplexer/filter assembly 126, an antenna switch 127, an antenna port 128, and a band-pass filter of the filter assembly 103. For the Rx operation, a signal received by the antenna 102 can be processed by the MB PAiD module 106 and be output at a port RX_MB. Such a received signal can be passed through the band-pass filter of the filter assembly 103, the antenna port 128, the antenna switch 127, a duplexer of the duplexer/filter assembly 126, a pre-LNA switch 125 of the band-selection switch assembly 123, and an LNA 122.

The front-end architecture 100 further includes a PA module 108 configured to provide Tx operations for MB and HB bands. In some embodiments, the MB/HB PA module 108 can be substantially free of filters or duplexers associated with UL CA operations. Instead, UL CA operations performed through the MB/HB PA module 108 can utilize filters or duplexers of the HB PAiD module 104 or the MB PAiD module 106, to thereby avoid filter duplication in the MB/HB PA module 108. Examples of how such re-use of filters for UL CA operations are described herein in greater detail.

An input port TX_MB/HB can receive an RF signal to be amplified and transmitted. Such a signal can be an MB signal or an HB signal. Such a signal can be amplified by, for example, a broadband PA 130 (e.g., capable of amplifying MB and HB signals) and be routed to the antenna 102 through a post-PA switch 134 in the MB/HB PA module 108, and through the HB PAiD module 104 or the MB PAiD module 106. Examples related to both of such signal routing configurations are described herein in greater detail.

In some embodiments, the front-end architecture 100 can include a first power management unit (PMU 1) 140 configured to provide power to both of the HB PAiD module 104 and the MB PAiD module 106. As described herein, PMU 1 can be configured to provide an appropriate supply voltage to the PA 110 of the HB PAiD module 104 (through a supply port 111) when the HB PAiD module 104 is processing an HB signal. Similarly, PMU 1 can be configured to provide an appropriate supply voltage to the PA 120 of the MB PAiD module 106 (through a supply port 121) when the MB PAiD module 106 is processing an MB signal.

In some embodiments, the front-end architecture 100 can include a second power management unit (PMU 2) 150 configured to provide power to the MB/HB PA module 108 (through a supply port 132). As described herein, PMU 2 can be configured to provide an appropriate supply voltage to the broadband PA 130 when the MB/HB PA module 108 is processing an MB signal, and to provide another appropriate supply voltage to the broadband PA 130 when the MB/HB PA module 108 is processing an HB signal.

Figure 2:
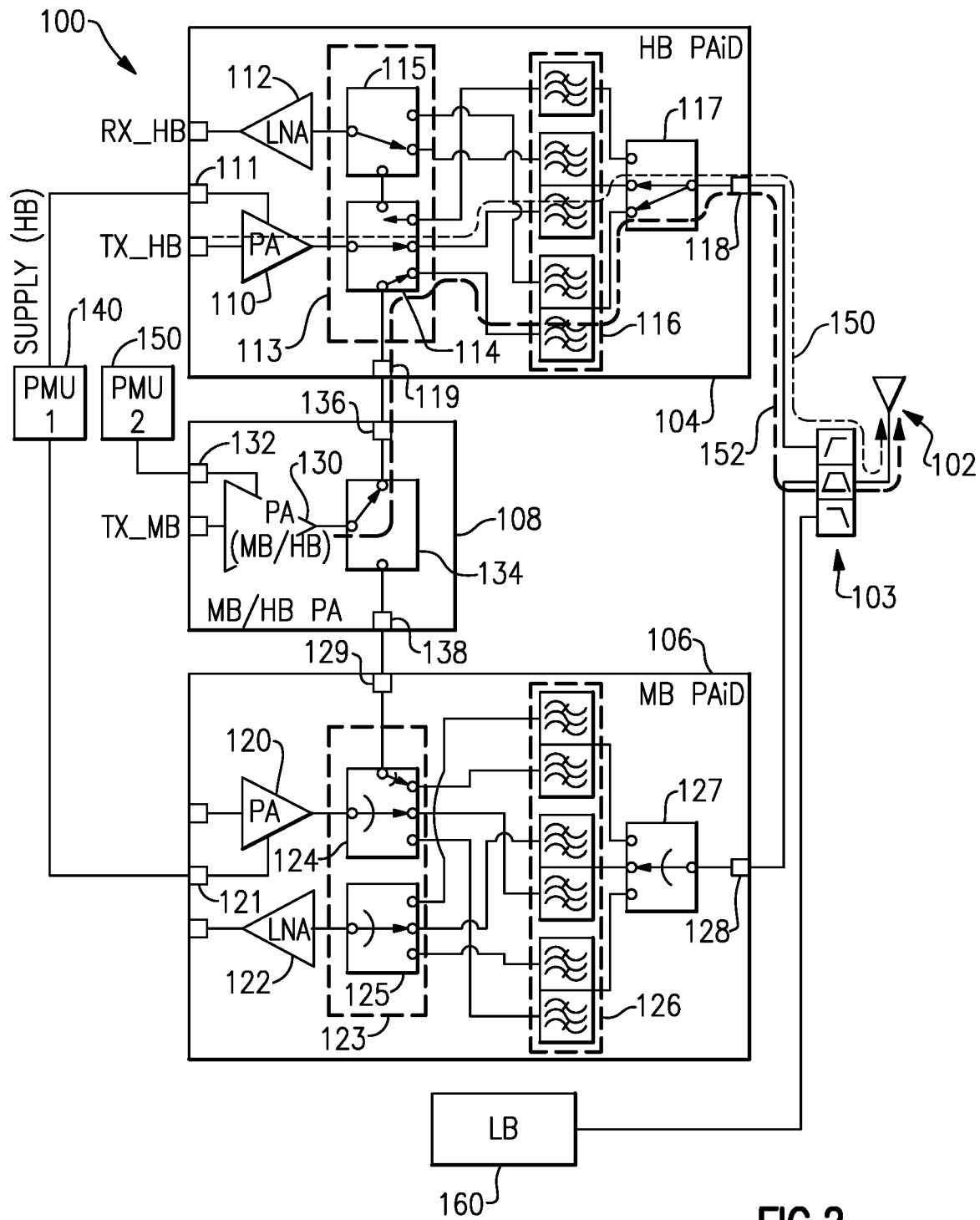
FIG. 2 illustrates the front-end architecture of FIG. 1 in a first configuration where an uplink carrier aggregation operation is being performed involving an MB signal and an HB signal.

FIG. 2 illustrates the front-end architecture 100 of FIG. 1 in a configuration where an UL CA operation is being performed involving an MB signal and an HB signal. The HB signal is processed by the HB PAiD module 104, and the MB signal is processed by the MB/HB PA module 108 and a portion of the HB PAiD module 104. More particularly, the input port TX_HB of the HB PAiD module 104 can receive the HB signal to be amplified and transmitted. Such a signal can be amplified by the PA 110 and be routed to the antenna 102 through the post-PA switch 114 of the band-selection switch assembly 113, a duplexer of the duplexer/filter assembly 116, the antenna switch 117, the antenna port 118, and the high-pass filter of the filter assembly 103. An example path of the HB signal is indicated as 150.

For the MB signal, the input port TX_MB/HB of the MB/HB PA module 108 can receive the MB signal to be amplified and transmitted. Accordingly, the input port TX_MB/HB is indicated as TX_MB. Such a signal can be amplified by the broadband PA 130 and be routed to the antenna 102 through the post-PA switch 134 of the MB/HB PA module 108, a first output port 136, an additional input port 119 of the HB PAiD module 104, the post-PA switch 114 of the band-selection switch assembly 113, a duplexer of the duplexer/filter assembly 116, the antenna switch 117, the antenna port 118, and the band-pass filter of the filter assembly 103. An example path of the MB signal is indicated as 152.

The foregoing routing of the MB signal through the MB/HB PA module 108 and the HB PAiD module 104 (to thereby re-use a filter of the HB PAiD module 104) can be facilitated by the post-PA switch 134 of the MB/HB PA module 108 and the post-PA switch 114 of the HB PAiD module 104. In some embodiments, the post-PA switch 134 of the MB/HB PA module 108 can be configured to include an SPDT (single-pole double-throw) functionality, with the pole being coupled to the output of the broadband PA 130, and the first throw being coupled to the first output port 136 of the MB/HB PA module 108. In some embodiments, the post-PA switch 114 of the HB PAiD module 104 can include a switching functionality that allows a connection or disconnection between the additional input port 119 and the corresponding duplexer, both of the HB PAiD module 104. It will be understood that such switching functionality can be implemented in a number of ways.

The antenna switch 117 can be configured to allow simultaneous routing of the HB signal 150 and the MB signal 152 to the antenna port 118. It will be understood that such switching functionality can be implemented in a number of ways.

The first PMU (PMU 1) can be configured to provide a supply voltage (Supply (HB)) that is suitable for the operation of the PA 110, to the HB PAiD module 104. The second PMU (PMU 2) can be configured to provide a supply voltage that is suitable for the operation of the broadband PA 130, to the MB/HB PA module 108.

Figure 3:
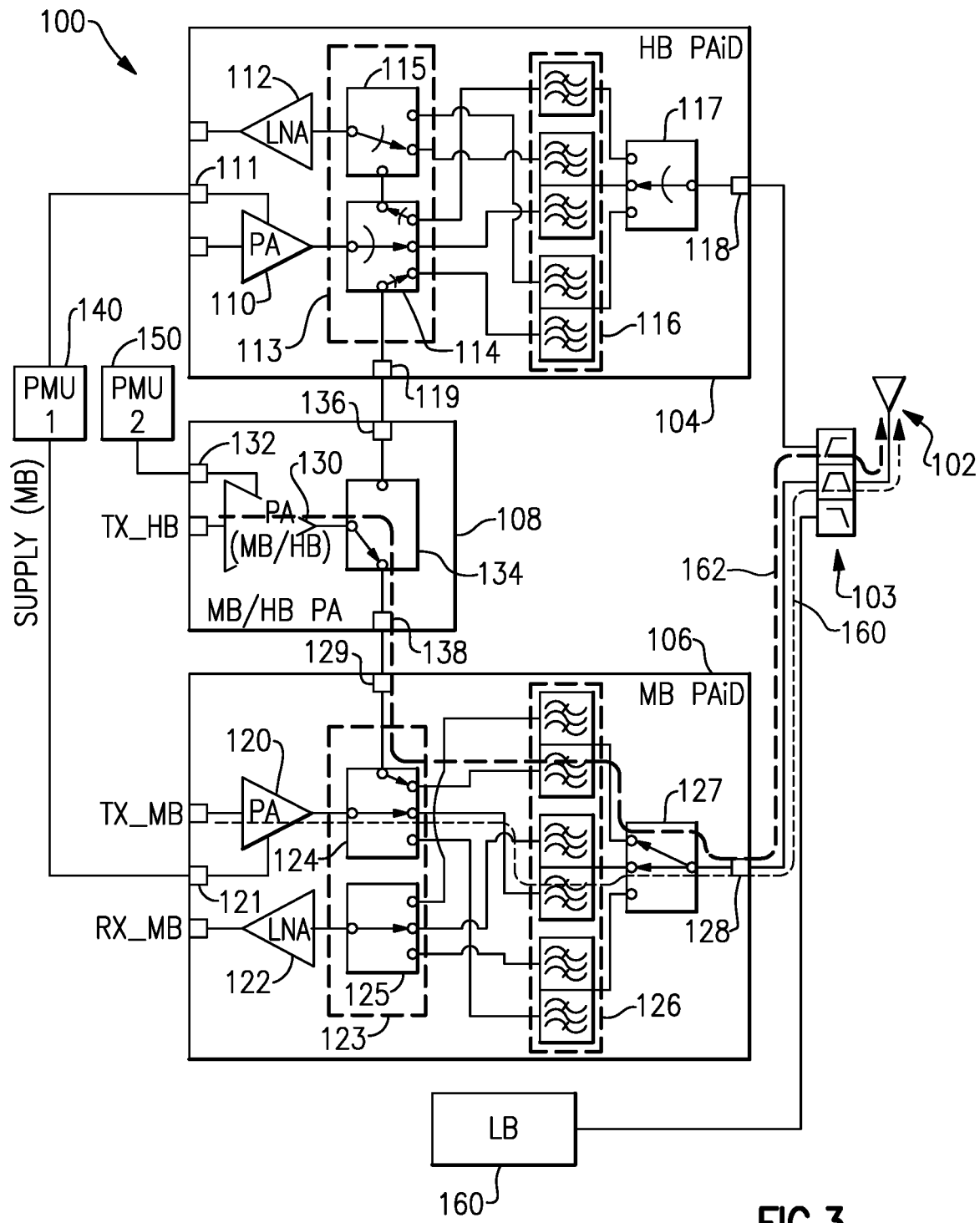
FIG. 3 illustrates the front-end architecture of FIG. 1 in a second configuration where an uplink carrier aggregation operation is being performed involving an MB signal and an HB signal

FIG. 3 illustrates the front-end architecture 100 of FIG. 1 in a configuration where an UL CA operation is being performed involving an MB signal and an HB signal. The MB signal is processed by the MB PAiD module 106, and the HB signal is processed by the MB/HB PA module 108 and a portion of the MB PAiD module 106. More particularly, the input port TX_MB of the MB PAiD module 106 can receive the MB signal to be amplified and transmitted. Such a signal can be amplified by the PA 120 and be routed to the antenna 102 through the post-PA switch 124 of the band-selection switch assembly 123, a duplexer of the duplexer/filter assembly 126, the antenna switch 127, the antenna port 128, and the band-pass filter of the filter assembly 103. An example path of the MB signal is indicated as 160.

For the HB signal, the input port TX_MB/HB of the MB/HB PA module 108 can receive the HB signal to be amplified and transmitted. Accordingly, the input port TX_MB/HB is indicated as TX_HB. Such a signal can be amplified by the broadband PA 130 and be routed to the antenna 102 through the post-PA switch 134 of the MB/HB PA module 108, a second output port 138, an additional input port 129 of the MB PAiD module 106, the post-PA switch 124 of the band-selection switch assembly 123, a duplexer of the duplexer/filter assembly 126, the antenna switch 127, the antenna port 128, and the high-pass filter of the filter assembly 103. An example path of the HB signal is indicated as 162.

The foregoing routing of the HB signal through the MB/HB PA module 108 and the MB PAiD module 106 (to thereby re-use a filter of the MB PAiD module 106) can be facilitated by the post-PA switch 134 of the MB/HB PA module 108 and the post-PA switch 124 of the MB PAiD module 106. In some embodiments, the post-PA switch 134 of the MB/HB PA module 108 can be configured to include an SPDT functionality, with the pole being coupled to the output of the broadband PA 130, and the second throw being coupled to the second output port 138 of the MB/HB PA module 108. In some embodiments, the post-PA switch 124 of the MB PAiD module 106 can include a switching functionality that allows a connection or disconnection between the additional input port 129 and the corresponding duplexer, both of the MB PAiD module 106. It will be understood that such switching functionality can be implemented in a number of ways.

The antenna switch 127 can be configured to allow simultaneous routing of the MB signal 160 and the HB signal 162 to the antenna port 128. It will be understood that such switching functionality can be implemented in a number of ways.

The first PMU (PMU 1) can be configured to provide a supply voltage (Supply (MB)) that is suitable for the operation of the PA 120, to the MB PAiD module 106. The second PMU (PMU 2) can be configured to provide a supply voltage that is suitable for the operation of the broadband PA 130, to the MB/HB PA module 108.

As described herein in reference to FIGS. 1-3, the front-end architecture 100 can allow an UL CA capable PA module (e.g., the MB/HB PA module 108) to transmit re-using an existing filter associated with a PAiD module (e.g., a filter of the HB PAiD module 104 or a filter of the MB PAiD module 106). As also described herein, the front-end architecture 100 can enable UL CA of MB and HB signals despite HB PAiD module and MB PAiD module sharing a common PMU.

In some implementations, an architecture, a device and/or a circuit having one or more features described herein can be included in an RF device such as a wireless device. Such an architecture, a device and/or a circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc.

Figure 4:
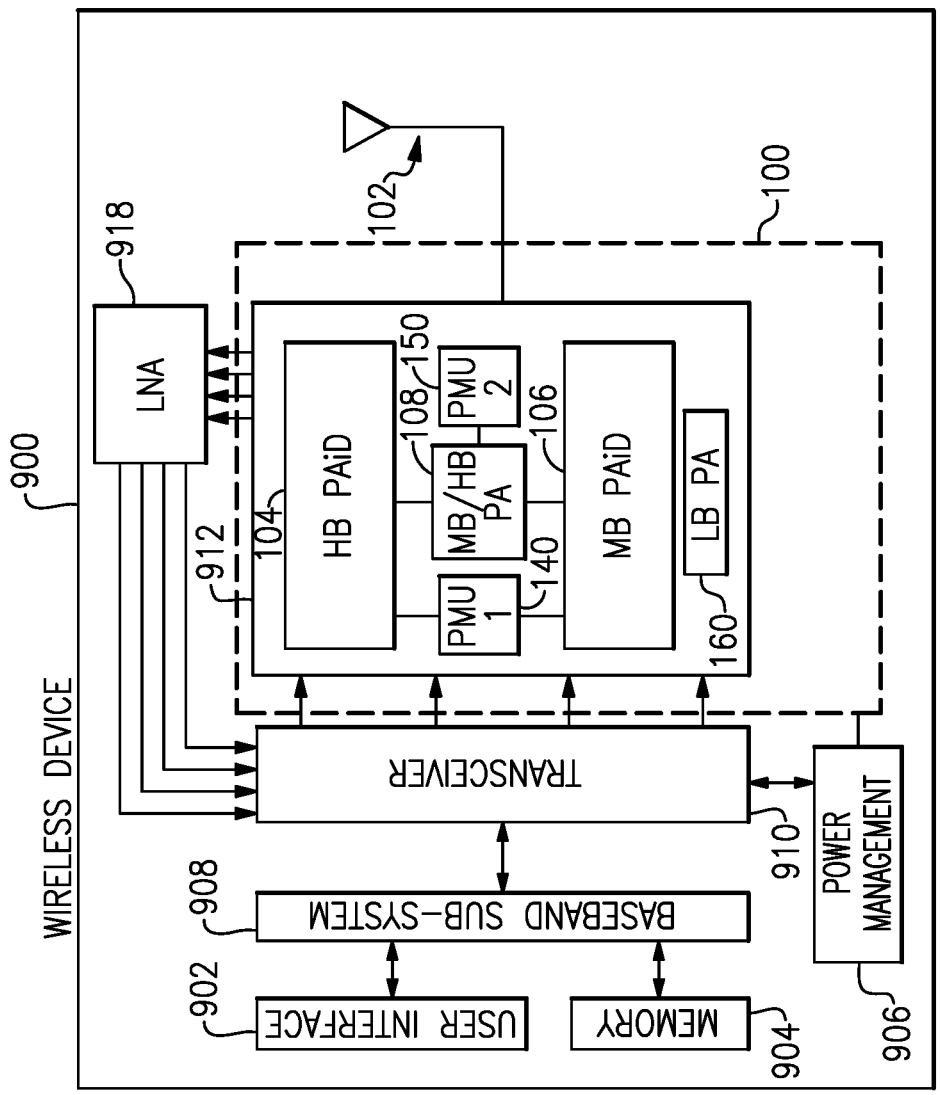
FIG. 4 illustrates an example wireless device having a front-end architecture configured for uplink carrier aggregation operation.

FIG. 4 depicts an example wireless device 900 having one or more advantageous features described herein. In some embodiments, such advantageous features can be implemented in a front-end (FE) architecture generally indicated as 100. As described herein, such an architecture can include an HB PAiD module 104, an MB PAiD module 106, and an MB/HB PA module 108 that can be filter-less. As also described herein, such an architecture can include a first PMU 140 configured to provide supply power to the HB PAiD module 104 and the MB PAiD module 106. A second PMU 150 can be configured to provide supply power to the MB/HB PA module 108. In some embodiments, the front-end architecture 100 may or may not include an LB PA module 160.

Various PAs in the foregoing front-end architecture 100 are indicated as 912. Such PAs can receive their respective RF signals from a transceiver 910 that can be configured and operated to generate RF signals to be amplified and transmitted, and to process received signals. The transceiver 910 interacts with a baseband sub-system 908 that is configured to provide conversion between data and/or voice signals suitable for a user and RF signals suitable for the transceiver 910. The transceiver 910 is connected to a power management component 906 that is configured to manage power for the operation of the wireless device 900. Such power management can control operations of the baseband sub-system 908 and the PMUs 140, 150.

The baseband sub-system 908 is connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In the example wireless device 900, the front-end architecture 100 can include an antenna 102, a connection to such an antenna, or any combination thereof. Received signals can be routed from the antenna 102 to one or more low-noise amplifiers (LNAs) 918. Amplified signals from the LNAs 918 can be routed to the transceiver 910.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |

TABLE 1-continued

| Band | Mode | Tx Frequency Range (MHz) | Rx Frequency Range (MHz) |
|---|---|---|---|
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for re-using filters to filter radio-frequency signals to facilitate uplink carrier aggregation in wireless communications, the method comprising:
   receiving at a power amplifier module a mid-band signal;
   amplifying the mid-band signal with a power amplifier of the power amplifier module;
   directing, using a post-amplifier switch assembly of the power amplifier module, the amplified mid-band signal to a band-selection switch assembly of a high-band module having a plurality of filters;
   receiving at the power amplifier module a high-band signal having a frequency falling in a high-band frequency range;
   amplifying the high-band signal with the power amplifier of the power amplifier module; and
   directing, using the post-amplifier switch assembly of the power amplifier module, the amplified high-band signal to a band-selection switch assembly of a mid-band module having a plurality of filters.

2. The method of claim 1 further comprising routing the amplified mid-band signal to a duplexer of the plurality of filters of the high-band module using the band-selection switch assembly of the high-band module.

3. The method of claim 2 further comprising routing the amplified high-band signal to a duplexer of the plurality of filters of the mid-band module using the band-selection switch assembly of the mid-band module.

4. The method of claim 1 further comprising providing electrical power using a first power management unit to the power amplifier module and selectively providing electrical power using a second power management unit to the high-band module and to the mid-band module.

5. The method of claim 4 further comprising supplying power to the power amplifier module using the first power management unit to amplify the mid-band signal, and supplying power to the high-band module using the second power management unit to amplify a second high-band signal received at the high-band module at the same time as the mid-band signal.

6. The method of claim 5 wherein the band-selection switch assembly of the high-band module is configured to provide simultaneous paths to corresponding duplexers of the plurality of filters for the amplified mid-band signal and the amplified second high-band signal.

7. The method of claim 5 further comprising directing the amplified mid-band signal and the amplified second high-band signal to an antenna through an antenna switch of the high-band module.

8. The method of claim 7 further comprising directing the amplified mid-band signal through a band-pass filter of a filter assembly coupled to the antenna and directing the amplified second high-band signal through a high-pass filter of the filter assembly.

9. The method of claim 4 further comprising supplying power to the power amplifier module using the first power management unit to amplify the high-band signal; and supplying power to the mid-band module using the second power management unit to amplify a second mid-band signal received at the mid-band module.

10. The method of claim 9 wherein the band-selection switch assembly of the mid-band module is configured to provide simultaneous paths to corresponding duplexers of the plurality of filters for the amplified high-band signal and the amplified second mid-band signal.

11. The method of claim 9 further comprising directing the amplified high-band signal and the amplified second mid-band signal to an antenna through an antenna switch of the mid-band module.

12. The method of claim 11 further comprising directing the amplified high-band signal through a high-pass filter of a filter assembly coupled to the antenna and directing the amplified second mid-band signal through a band-pass filter of the filter assembly.

13. A method for providing uplink carrier aggregation comprising:
   receiving a first signal at a first module, the first signal falling within a first frequency band;
   amplifying the first signal using a power amplifier of the first module;
   directing the amplified first signal to a first duplexer of a duplexer assembly of the first module using a band-selection switch assembly of the first module;
   receiving a second signal at a second module, the second signal falling within a second frequency band different from the first frequency band;

amplifying the second signal using a broadband power amplifier of the second module; and directing the amplified second signal to a second duplexer of the duplexer assembly of the first module using a post-amplifier switch assembly of the second module and the band-selection switch assembly of the first module.

14. The method of claim 13 further comprising:

receiving a third signal at a third module, the third signal falling within the second frequency band;

amplifying the third signal using a power amplifier of the third module; and directing the amplified third signal to a first duplexer of a duplexer assembly of the third module using a band-selection switch assembly of the third module.

15. The method of claim 14 further comprising:

receiving a fourth signal at the second module, the fourth signal falling within the first frequency band;

amplifying the fourth signal using the broadband power amplifier of the second module; and directing the amplified fourth signal to a second duplexer of the duplexer assembly of the third module using the post-amplifier switch assembly of the second module and the band-selection switch assembly of the third module.

16. The method of claim 15 further comprising directing the amplified first signal to an antenna through a high-pass filter of a filter assembly coupled to the antenna and directing the amplified second signal to the antenna through a band-pass filter of the filter assembly.

17. The method of claim 15 further comprising directing the amplified fourth signal to an antenna through a high-pass filter of a filter assembly coupled to the antenna and directing the amplified third signal to the antenna through a band-pass filter of the filter assembly.

18. The method of claim 15 further comprising providing electrical power using a first power management unit to the second module and selectively providing electrical power using a second power management unit to the first module and to the third module.

19. The method of claim 18 further comprising supplying power to the second module using the first power management unit to amplify the second signal; and supplying power to the first module using the second power management unit to amplify the first signal.

20. The method of claim 18 further comprising supplying power to the second module using the first power management unit to amplify the third signal; and supplying power to the third module using the second power management unit to amplify the fourth signal.

* * * * *